US007150195B2

(12) United States Patent
Jacobsen et al.

(10) Patent No.: US 7,150,195 B2
(45) Date of Patent: Dec. 19, 2006

(54) SEALED CAPACITIVE SENSOR FOR PHYSICAL MEASUREMENTS

(75) Inventors: Henrik Jacobsen, Horten (NO); Terje Kvisteroy, Horten (NO)

(73) Assignee: Infineon Technologies SensoNor AS, Horten (NO)

( * ) Notice: Subject to any disclaimer, the term of this patent is extended or adjusted under 35 U.S.C. 154(b) by 0 days.

(21) Appl. No.: 10/915,485

(22) Filed: Aug. 11, 2004

(65) Prior Publication Data
US 2005/0076719 A1    Apr. 14, 2005

(30) Foreign Application Priority Data
Oct. 10, 2003   (EP)   ................... 03256397

(51) Int. Cl.
*G01L 7/08*   (2006.01)
(52) U.S. Cl. .............................. 73/715; 73/718; 73/724
(58) Field of Classification Search ........... 73/700–756
See application file for complete search history.

(56) References Cited

U.S. PATENT DOCUMENTS

| 4,426,673 A | * | 1/1984 | Bell et al. ................. 361/283.4 |
| 6,109,113 A | * | 8/2000 | Chavan et al. ................. 73/718 |
| 6,436,853 B1 | | 8/2002 | Lin et al. |
| 6,449,139 B1 | * | 9/2002 | Farahmandi et al. ........ 361/502 |
| 6,470,754 B1 | * | 10/2002 | Gianchandani .............. 73/718 |
| 6,548,328 B1 | * | 4/2003 | Sakamoto et al. .......... 438/121 |
| 6,564,643 B1 | * | 5/2003 | Horie et al. ................... 73/724 |
| 6,909,178 B1 | * | 6/2005 | Sakamoto et al. .......... 257/725 |

FOREIGN PATENT DOCUMENTS

| EP | 0 010 204 A1 | 4/1980 |
| EP | 0 994 330 A1 | 4/2000 |

OTHER PUBLICATIONS

Jurgen Wibbeler et al., "Parasitic Charging of Dielectric Surfaces in Capacitive Microelectromechanical Systems (MEMS)", Sensors and Actuators A 71 (1988), Apr. 6, 1998, pp. 74-80.
Abhijeet V. Chavan et al., "Batch-Processed Vacuum-Sealed Capacitive Perssure Sensors", Journal of Microelectromechanical Systems, pp. 580-588, vol. 10, No. 4, Dec. 2001.

\* cited by examiner

*Primary Examiner*—Edward Lefkowitz
*Assistant Examiner*—Jermaine Jenkins
(74) *Attorney, Agent, or Firm*—Edell, Shapiro & Finnan, LLC

(57) ABSTRACT

A capacitive-type sensor comprises a glass plate having an electrode formed thereon, and a micromachined structure formed from a semiconductor material and having an insulating rim formed thereon. A conducting seal is formed on the insulating rim and arranged to be bonded to the glass substrate to define an enclosed cavity containing the electrode, to thereby define a capacitive element, the conducting seal being arranged, in use, to have an electrical signal passed there through to determine a capacitance thereof which is indicative of the parameter to be determined by the sensor.

18 Claims, 4 Drawing Sheets

SEALED CAPACITIVE SENSOR FOR PHYSICAL MEASUREMENTS

BACKGROUND

Silicon sensors are extensively used in a large and increasingly varied field, including important areas such as medical instrumentation, automotive applications such as engine control and tyre pressure monitoring, industrial process control and the avionics industry. The most commonly used conversion principles for silicon based sensors are capacitive detection and piezoresistive detection.

Piezoresistive sensors are generally considered to be more robust than capacitive sensors. Another advantage is that they give an output signal proportional to the input with good linearity. Capacitive sensors, on the other hand, have the advantage over the piezoresistive type in that they consume less power, but have a non-linear direct output signal and are more sensitive to electromagnetic interference. Capacitive silicon sensors can be made to be small in size and can easily be made by surface micromachining. However, they are not very robust and their pressure sensitive diaphragm needs to be protected against the pressure media by a gel or, other flexible material in most applications. This results in an increase in vibration sensitivity due to the mass added to the top of the diaphragm. Advanced and well proven methods of manufacturing silicon pressure sensors and inertial sensors are described in the patent publications EP-A-742581 and EP-A-994330, but these have the problems mentioned above.

SUMMARY

The present invention seeks to provide a capacitive silicon sensor arrangement that overcome the above mentioned problems.

According to the present invention there is provided a capacitive-type sensor comprising:

a glass plate having an electrode formed thereon; and a micromachined structure formed from a semiconductor material and having an insulating rim formed thereon; and a conducting seal formed on the insulating rim and arranged to be bonded to the glass substrate to define an enclosed cavity containing the electrode, to thereby define a capacitive element, the conducting seal being arranged, in use, to have an electrical signal passed there through to determine a capacitance thereof which is indicative of the parameter to be determined by the sensor.

This invention teaches a capacitive arrangement for the measurement of physical measurands such as pressure, flow and acceleration. The pressure sensor arrangement of this invention has a micromachined silicon diaphragm acting as the movable electrode in the capacitor, an on-chip vacuum reference volume sealed by anodic bonding acting as the gap in the capacitor and with the counter electrode of the capacitor on glass, connected to the outside of the sealed cavity by a conduction system consisting of metal interconnects on the glass, press contacts between the hermetically sealed cavity. The invention results in robust and reliable sensors with good media compatibility, obtained by having the measureand inlet towards the rear side of the silicon diaphragm. The process technology that is used results in low manufacturing cost, as is required for high volume applications such as in the automotive industry. Versions can be made that allow trimming of the capacitance value by forming the electrode system on glass with capacitors connected in parallel. Other versions may include integration of MOS-capacitors.

This invention is made possible by using silicon planar processing combined with silicon bulk micromaching processes such as dry etching, anisotropic and selective etching, thin-film metallization of glass and anodic bonding between glass and a thin-film layer. All of these techniques are well known within microsystem technology (MST) and micro-electro-mechanical systems (MEMS).

Although silicon is used as the material of choice in the description, the invention is not limited to silicon and can also be made by using other semiconductor materials such as III–V semiconductors such as GaAs or the high-temperature semiconductor SiC.

BRIEF DESCRIPTION OF THE DRAWINGS

For a good understanding of the invention and its features and advantages, reference is made to detailed descriptions and the drawings, in which.

DETAILED DESCRIPTION

Figure 1:
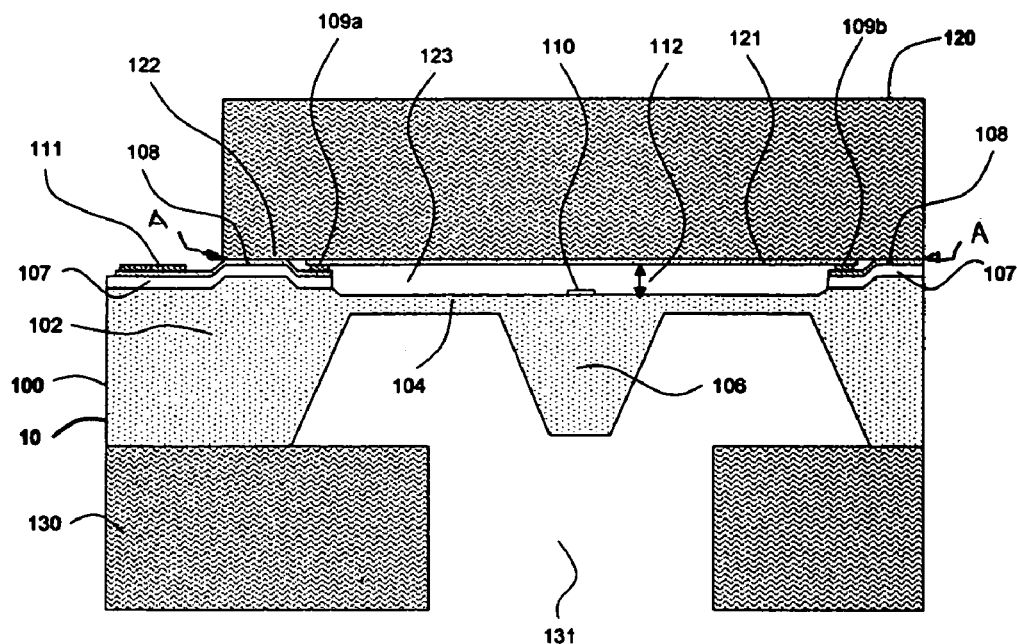
FIG. 1 is a cross sectional view of a first and basic type of a capacitive absolute pressure sensor in accordance with the present invention.
Figure 2:
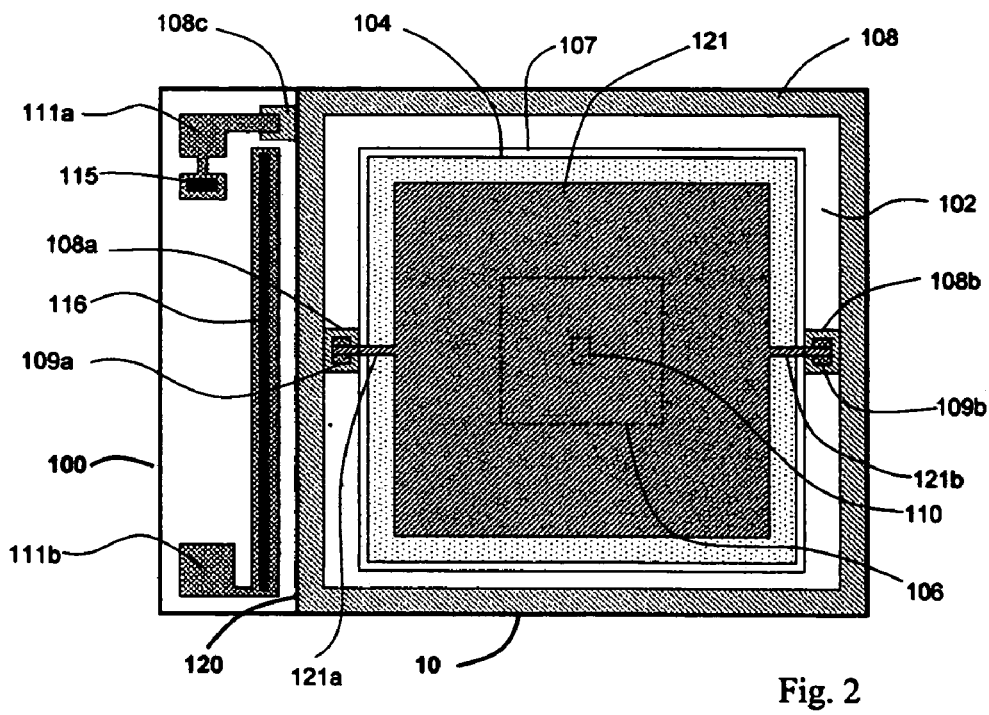
FIG. 2 is a top plan view of the pressure sensor of FIG. 1 through the line A—A.

Referring to FIGS. 1 and 2, a sensor has a silicon part 100, formed on a substrate with a rigid support rim 102 and a flexible microstructure which forms a thin flexible diaphragm 104. The substrate is heavily doped in order to obtain low series resistance. A shallow recess is etched in the diaphragm 104, and the support rim 102 has an electrically insulating layer 107 on the surface thereof. A conductive thin film layer 108 is formed on the electrically insulating layer 107 as a ring which surrounds the diaphragm 104.

A first glass part 120 has a thin-film surface conduction system, formed with metal interconnects, on its surface, which constitutes a plate electrode 121 facing the silicon diaphragm 104. The glass 120 is anodically bonded to the conductive thin film layer on the silicon part 100, thereby forming a complete seal ring 108 at the interface 122.

As shown in FIGS. 1 and 2, the plate electrode 121 makes contact with the electrically conductive thin film seal ring 108 via electrical press contacts 109a and 109b. In this way, the etched recess of the diaphragm 104 provides a sealed cavity 123 within the device.

The substrate 100 and the glass part 120 form a capacitive sensing device with the plate electrode 121, on the glass 120, acting as the first electrode. This electrode is electrically connected to a wire bonding pad 111a, that is outside of the sealed cavity 123, via the press contacts 109a, 109b formed between the electrode 121 and the metal seal ring 108. The sealed cavity 123 acts as the electrical isolation gap in the capacitor. The flexible diaphragm 104 is the second electrode of the variable capacitor, and is electrically connected via the support rim 102 to an electrical contact pad 111b outside the sealed cavity.

Sensing function is provided by a change in capacitance when a force acts on the flexible structure of the diaphragm 104, thereby pressing the diaphragm 104 in the direction towards the plate electrode 121 on the glass, giving a smaller gap 123 in the capacitor.

Preferably, insulating layer 107 is formed on a dielectric material and the seal-ring 108 also acts as a conductor to provide electrical contact between the plate electrode 121 on the glass 120 and the wire bonding pad 111a situated outside the cavity.

As described above, the basic sensing device shown in FIGS. 1 and 2 comprises a flexible microstructure which can take the form of a thin diaphragm 104. In this case, pressure acting on the diaphragm 104 presses the diaphragm 104 towards the plate electrode 121, in the form of the thin-film conduction system. The gap 112 between the electrodes therefore decreases. The sensing device can therefore be used as a pressure sensor to detect changes in air or liquid pressures.

The sensor of FIGS. 1 and 2 also includes a resilient centre boss 106, and an electrically insulating mechanical overload protection component 110. This component ensures that, under the influence of an extreme change in the parameter being sensed, the component 110 makes contact with the electrode 121 on the glass 120, thereby ensuring the continued electrical isolation of the two electrodes.

Figure 3:
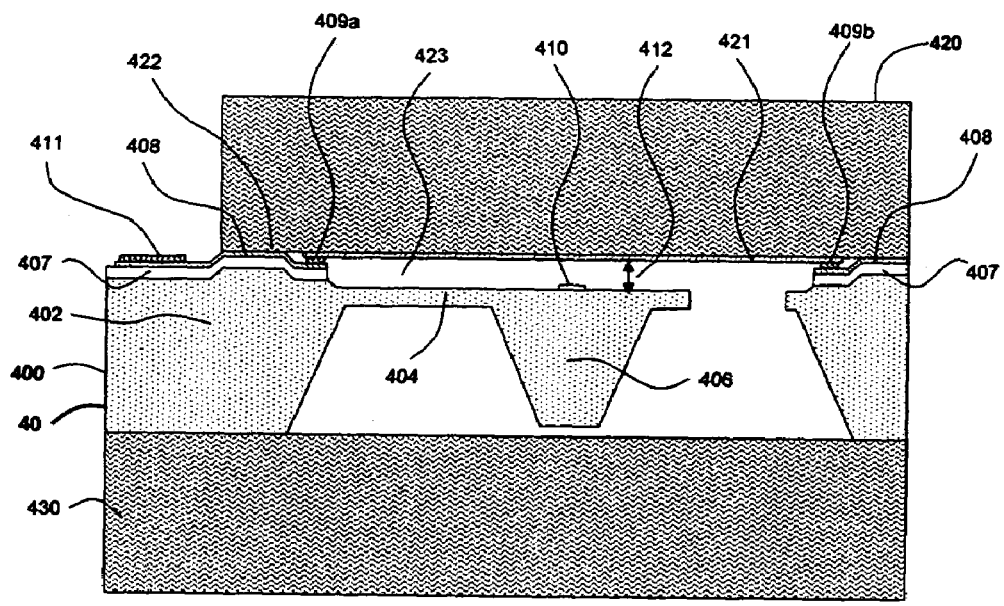
FIG. 3 is a top plane view of a capacitive acceleration sensor in accordance with the present invention.

FIG. 3 shows another example of the sensing device of the present invention, in the form of a capacitive accelerometer. The accelerometer 40 comprises a silicon part 400 built on a substrate 430. The silicon part 400 has a rigid support rim 402 joined by a thin, flexible spring to seismic mass 406, such that the mass 406 is supported at the end of the spring. The spring and mass constitute a thin, flexible diaphragm 404 which is electrically connected to an electrical contact pad (not shown) through the support rim 402.

The silicon support rim 402 has an electrically insulating ring-shaped layer 407, the surface of which has an electrically conductive, thin-film layer 408. This thin-film layer acts an electrically conductive seal ring 408 which surrounds the diaphragm 404, and is similar to the seal ring 108 of the pressure sensor of FIG. 1.

A glass part 420 of the capacitor accelerometer 40 has a thin-film conduction system, formed with metal interconnects, on its surface, which faces the silicon part 400. The conduction system acts as a plate electrode in use.

The glass part 420 is anodically bonded to the silicon part 400 in order to form a complete seal at the interface 422 between the two parts.

As can be seen from FIG. 3, the seal-ring 408 has press contact areas 409A, 409B formed between the electrode 421 and the seal ring 408, and is connected to the wire bonding area 411 that is situated outside the capacitive accelerometer, in order to provide an electrical connection out of and/or into the sensing device. Press contacts 409A and 409B form an effective electrical connection between the plate electrode 421 and the thin-film seal ring 408.

A shallow recess is etched in the thin diaphragm 404 such that, when the glass and silicon parts are connected as described above, a vacuum reference volume, exists between the plate electrode 421 and diaphragm 404. A sealed cavity 423 is therefore provided between the glass 420 and the silicon 400 parts of the sensing device. This seal cavity 423 acts as an electrical isolation gap of the capacitive accelerometer.

In use, the plate electrode 421 and seismic mass 406 of the silicon diaphragm 404 act as the first and second electrodes, respectively, of the capacitive accelerometer 40.

The accelerometer 40 functions in a similar way to the capacitive pressure sensor 10 described above. An acceleration acting on the mass 406 forces the diaphragm 404 to deflect in a direction towards or away from the plate electrode 421, thereby altering the size of the gap 412 between the electrodes, and hence the capacitance value measured. In order to maintain electrical isolation between the electrodes in the case where a relatively large acceleration is sensed, an electrically insulating mechanical overload protection component 410 is provided on the diaphragm 404.

Figure 4:
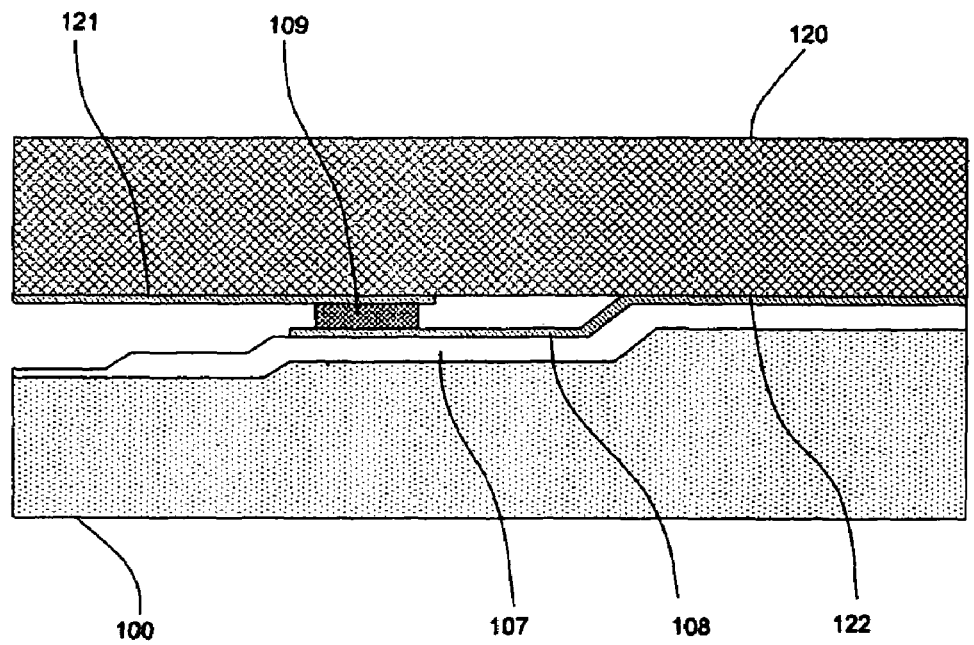
FIG. 4 shows details of one arrangement of the press contacts between metal electrode on glass and the metal of the seal-ring of FIG. 1.
Figure 5:
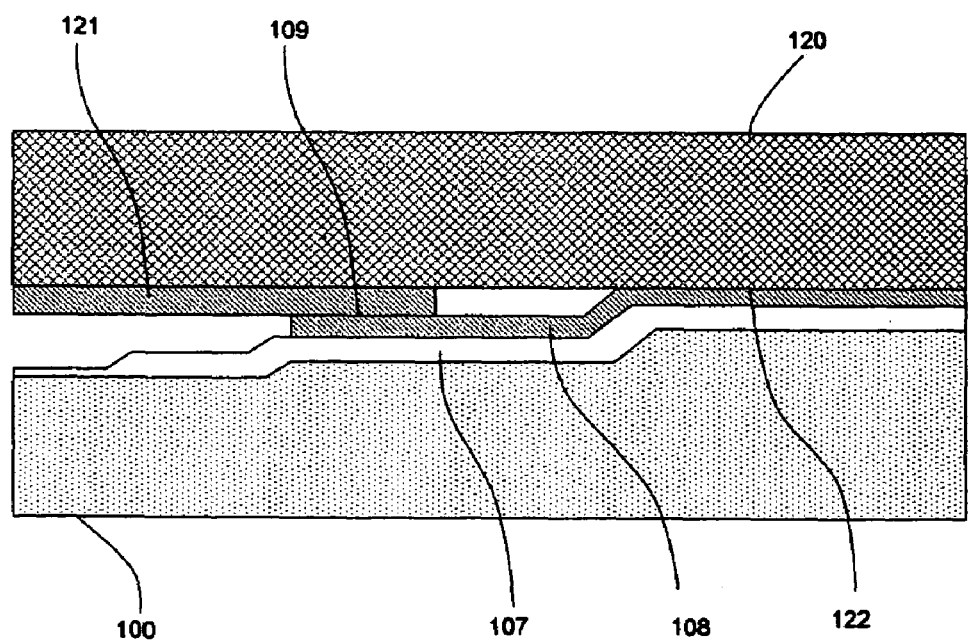
FIG. 5 shows details of a second arrangement of the press contacts between the metal on glass and the metal of the seal-ring of FIG. 1.

Referring to FIGS. 4 and 5, these show alternative configurations for forming the press contacts 109 of the sensing device. FIG. 4 shows details of a press contact 109 as a individual component which links the metal electrode 121 of the glass 120 to the metal of the seal ring 108. In FIG. 5, the metal of the electrode 121 and that of the seal ring 108, contact one another directly. These press contact arrangements use the seal-ring 122 to incorporate the sealing function and electrical contact function into a single component, thereby allowing for a simplified device, with fewer parts. This incorporation also makes the device easier to manufacture.

Figure 6:
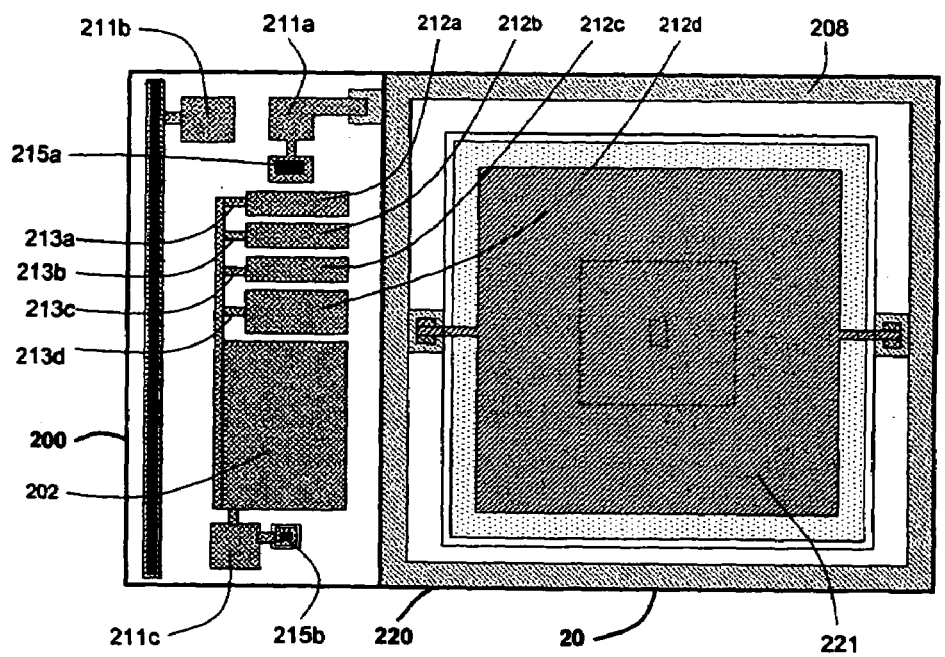
FIG. 6 is a top plan view of a second example of a capacitive absolute pressure sensor that includes a trimmable metal-oxide-semiconductor capacitor in accordance with the present invention.

FIG. 6 shows a further example of the invention in which a sensing device 20 is connected in series to one or more metal-oxide-semiconductor capacitors (MOS-capacitors) 212a–d via the substrate of the sensor. In the case of a plurality of MOS-capacitors, these are connected in parallel with one another. The MOS-capacitors should initially have a capacitance value higher than that of the sensor, and have interconnect 213a–d designed with areas which can be removed using a laser beam. By "trimming" the MOS-capacitor in this way, its capacitance value is reduced, and hence the overall capacitance value of the system, is increased.

By increasing the overall capacitance in this way the ratio at which the capacitor changes as a function of the detected parameter, the sensitivity of the device, can be set at a constant defined value that is not dependent on processing tolerances.

Figure 7:
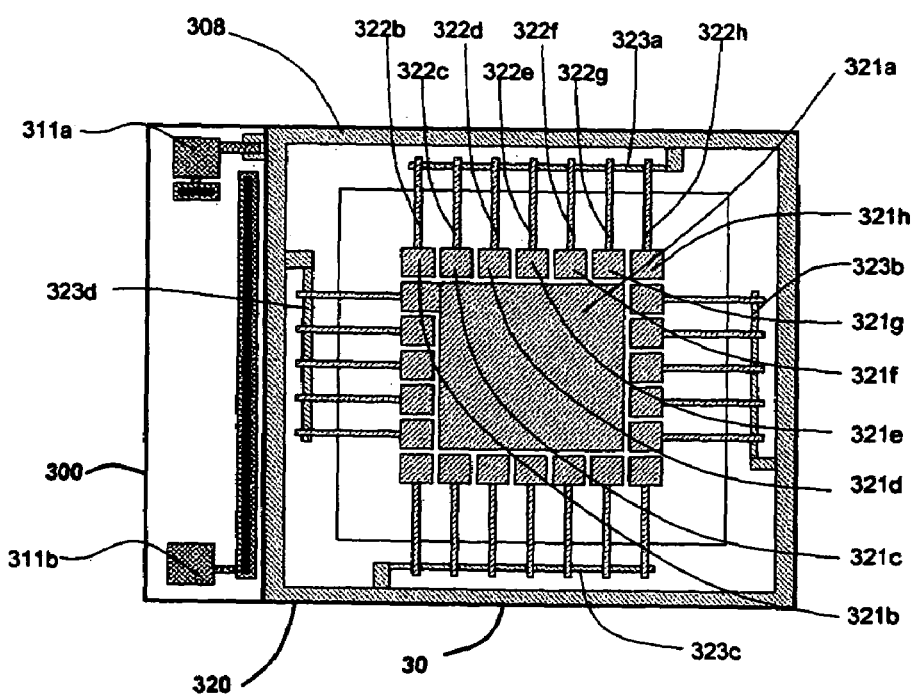
FIG. 7 is a top plane view of a third example of a capacitive pressure sensor with a trimmable electrode pattern in accordance with the present invention.

A further way of "trimming" the overall capacitance value is presented in the example of a sensor 30 shown in FIG. 7. Here, the electrode pattern on the glass part 320 of the sensor 30 comprises at least two electrodes. The electrodes 321a–h are connected in parallel within the cavity by a metal interconnect system on the glass part, (322a–h) and the silicon part, (323a–d). The metal line connecting the top capacitance electrode can be cut through the glass using a laser beam, and the overall capacitance value of the sensor can be reduced.

Figure 8:
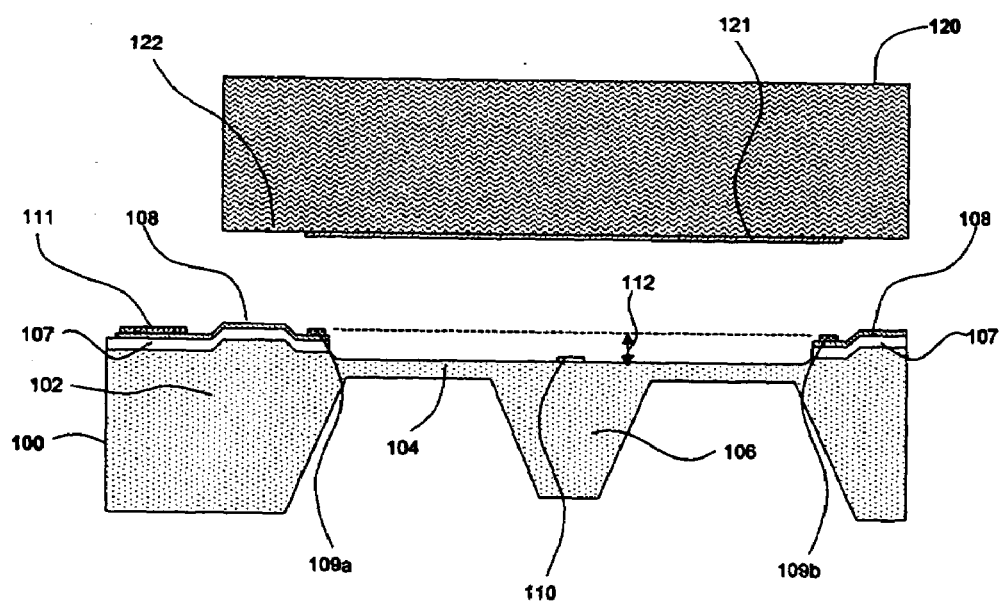
FIG. 8 shows the separate silicon and glass parts of the capacitive pressure sensor shown in FIGS. 1 and 2 before laminating the parts together by anodic bonding for forming of the sensor.

FIG. 8 illustrates a sequence of the manufacturing process of a device according to the present invention (as illustrated in FIGS. 1 and 2). The silicon substrate should be heavily doped via a standard lithographic method, ion implantation and/or high temperature diffusion of dopants. The silicon part 100 of the sensor, including the rigid support rim 102, can be manufactured by standard methods well-known within ths field of technology, such as silicon planar processors, double side photolithography, and wet and dry etching techniques. The recess is wet and/or dry etched on the silicon in two etching steps. The first of which creates press contacts 109a and 109b, and the second of which creates the recess to provide a gap 112 in the fully manufactured sensor. The electrically insulating layer 107 may be thermally grown or vapour deposited on the surface of the rigid support rim 102, and the seal ring 108, in the form of a conductive thin-film layer, may then be formed on top of this.

The metal plate electrode 121 on the glass part 120 can be made by standard methods for the fabrication of thin-film structures on glass. The gap 112 and position of the press contacts 109a and 109b can also be created by etching the recess in the glass 120, or by performing a combination of etching steps in both the glass parts 120 and the silicon part 100.

Manufacture of this sensing device is completed by anodically bonding, in a vacuum, a glass substrate 120 with metal electrode 121 and thin film interconnects already formed thereon, to the silicon substrate 100, resulting in a structure as shown in FIGS. 1 and 2, with the (anodic bonded) seal-ring 108 and the sealed cavity 123 formed by the recesses etched in the surface of the silicon substrate.

The invention claimed is:

1. A capacitive-type sensor comprising:
   a glass structure having an electrode thereon;
   a micromachined structure formed from a semiconductor material and having an insulating rim formed thereon; and
   a conducting seal formed on the insulating rim and arranged to be bonded to the glass structure to define an enclosed cavity containing the electrode, to thereby define a capacitive element, the conducting seal being arranged to have an electrical signal passed there through to determine a capacitance thereof which is indicative of a parameter to be determined by the sensor, wherein the conducting seal surrounds the cavity.

2. The sensor according to claim 1, wherein the micromachined structure includes a diaphragm.

3. The sensor according to claim 2, wherein an electrical connector is provided to the diaphragm.

4. The sensor according to claim 3, wherein the electrical connector for the diaphragm is provided by the semiconductor material.

5. The sensor according to claim 2, wherein the diaphragm includes a stiff center boss.

6. The capacitive sensor of claim 2, wherein the conducting seal surrounds the diaphragm.

7. The sensor according to claim 1, wherein the semiconductor material is silicon.

8. The sensor according to claim 1, wherein the semiconductor material comprises a rigid support rim.

9. The sensor according to claim 1, wherein the conducting seal between the glass structure and the semiconductor material is provided by anodic bonding.

10. The sensor according to claim 1, wherein additional press contacts are provided external to the enclosed cavity to allow for interaction with other devices.

11. The sensor according to claim 1, wherein the electrode is shaped such that, during manufacture of the sensor, a size of the electrode is adjustable to control the capacitance of the electrode.

12. The sensor according to claim 1, wherein the sensor is arranged to be a pressure sensor.

13. The sensor according to claim 1, wherein the sensor is arranged to be an accelerometer.

14. The sensor according to claim 1, wherein the conducting seal is electrically connected to the electrode on the glass structure.

15. The sensor according to claim 1, wherein the conducting seal is connected to an electrical bond pad outside the enclosed cavity.

16. A capacitive sensor comprising:
   a glass structure having an electrode thereon;
   a micromachined structure formed from a semiconductor material;
   an insulating rim formed on the micromachined structure; and
   a conductive seal ring formed on the insulating rim that bonds the glass structure such that it defines an enclosed cavity containing the electrode, thereby defining a capacitive element;
   wherein an electrical signal passes through the conducting seal to determine a capacitance of the seal ring, and wherein the capacitance is indicative of a parameter to be determined by the sensor, and
   wherein the conductive seal ring surrounds the cavity.

17. The sensor according to claim 16, wherein the micromachined structure includes a diaphragm, and the conductive seal ring surrounds the diaphragm.

18. A capacitive sensor comprising:
   a glass structure having an electrode thereon;
   a micromachined structure formed from a semiconductor material and including a diaphragm;
   an insulating rim formed on the micromachined structure; and
   a conductive seal ring formed on the insulating rim that bonds the glass structure such that it defines an enclosed cavity containing the electrode, thereby defining a capacitive element,
   wherein an electrical signal passes through the conducting seal to determine a capacitance of the seal ring, the capacitance is indicative of a parameter to be determined by the sensor, and the conductive seal ring surrounds the diaphragm.

* * * * *